United States Patent [19]

Farago

[11] Patent Number: 4,603,320

[45] Date of Patent: Jul. 29, 1986

[54] CONNECTOR INTERFACE

[75] Inventor: Steven Farago, Mount Kisco, N.Y.

[73] Assignees: Anico Research, Ltd. Inc., Mount Kisco; Rapitech Systems Inc., New York, both of N.Y.

[21] Appl. No.: 484,823

[22] Filed: Apr. 13, 1983

[51] Int. Cl.[4] .............................................. H03K 13/24
[52] U.S. Cl. ..................... 340/347 DD; 339/176 MP; 361/394
[58] Field of Search .............. 340/347 DD; 339/17 R, 339/17 C, 17 F, 14 R, 17 M, 17 LC, 17 N, 176 R, 176 M, 176 MP; 361/392–395, 412, 415; 364/705–771; 179/20 P

[56] References Cited

U.S. PATENT DOCUMENTS

| | | | |
|---|---|---|---|
| 3,643,135 | 2/1972 | Devort et al. | 361/395 |
| 3,885,167 | 5/1975 | Berglund | 340/347 DD |
| 4,027,941 | 6/1977 | Narozny | 339/14 R |
| 4,124,888 | 11/1978 | Washburn | 364/200 |
| 4,217,624 | 8/1980 | Tuck | 361/394 |
| 4,262,981 | 4/1981 | Goodman | 339/17 LC |
| 4,295,181 | 10/1981 | Chang et al. | 361/395 |
| 4,342,069 | 7/1982 | Link | 361/401 |
| 4,361,955 | 12/1982 | Lancaster | 339/17 F |
| 4,458,967 | 7/1984 | King et al. | 339/14 R |
| 4,487,464 | 12/1984 | Kirschenbaum | 339/19 |

Primary Examiner—Vit W. Miska
Attorney, Agent, or Firm—Israel Nissenbaum

[57] ABSTRACT

A connector interface for enabling communications between first and second data handling systems wherein the data in the first system is arranged in a first type of format and the data in the second system is arranged in a second type of format, includes a connector housing with first and second sets of electrical contact elements exposed at different portions of the housing. Circuitry contained entirely within the housing operates to convert data transmitted to the first set of contact elements from the first data handling system into corresponding data in the second type of format for transmission to the second data handling system through the second set of contact elements, and to convert data transmitted to the second set of contact elements from the second data handling system into corresponding data in the first format for transmission to the first data handling system. One set of electrical contact elements may, for example, be arranged to extend out from the connector housing in two parallel rows to allow the elements to be directly connected to corresponding terminals arranged in a dual in line configuration on an outside printed circuit board. The connector arrangement greatly simplifies the design and construction of data processing systems requiring specific interfaces between certain parts of the systems, such as between data terminal equipment and data communication equipment employing serial binary data interchange.

23 Claims, 7 Drawing Figures

CONNECTOR INTERFACE

BACKGROUND OF THE INVENTION

1. Field of the Invention

The present invention relates generally to elelctrical connectors, and particularly to a connector having internal circuitry capable of providing a specified electrical interface between various types of data handling equipment.

2. Description of the Prior Art

The proliferation of digital data processing equipment, first in business and now into the home, has created an ongoing demand for such equipment with ever increased capabilities but at an affordable price. The modern trend to integrate numerous discrete electrical components within single semiconductor integrated circuits or "chips", has provided for greater economies in the manufacture of digital electronic equipment. Not only is the overall physical size and weight of the equipment reduced through use of integrated circuit technology, but manufacturing costs also are alleviated in that the price of each integrated circuit used is but a fraction of the total cost represented by all the components it contains.

Digital data processing systems which are in common use today include portions arranged to allow the user to communicate with the system by way of, for example, a terminal or a printer. The user "talks" or provides information to the system through the terminal, and this information is converted into digital data which the system is capable of understanding. After the data is processed by the system which may include some form of computer, a suitable response is transmitted back to the user in digital form and then properly converted into visibly recognizable words or symbols on the screen of the terminal or on a sheet generated by a printer.

Accordingly, it is often necessary to provide cable interconnections between differently located units of a data processing system to allow the units to transmit and receive digital data to and from one another.

Certain types of digital equipment, e.g. a terminal or a printer, transmit or receive digital data in serial bit format. That is, each character (i.e., letter or numeral) of the data is sent or received one bit at a time. It will be appreciated that in a typical system where each character occupies multiple bits, communicating the characters as serial bits between separately located pieces of equipment reduces significantly the number of separate conductors which must be provided in the connecting cables, allows for the communicating equipments to operate in time synchronism with one another with regard to the data exchanged between them, as well as for the use of parity bits and other common error detecting techniques to be applied for each data character communicated. Other kinds of equipment in data handling systems operate in a parallel bit format. For example, computers operate on data which is loaded in internal registers one full character (i.e., eight bits) at a time, and likewise provide output information a character at a time to internal output registers.

In order to insure compatability between terminals, printers and other input/output data handling equipment which operate in a serial bit format, and computer mainframes and related equipment, the electronic Industries Association promulgated in 1969 a now widely accepted interface standard known as EIA RS-232-C, the provisions of which are incorporated by reference herein. The RS-232-C Standard, entitled "Interface Between Data Terminal Equipment and Data Communication Equipment Employing Serial Binary Data Interchange", ensures that serial bit format equipment produced by one manufacturer will operate properly with serial bit format equipment of another manufacturer. The RS-232-C Standard applies not only to the interchange of information data signals between data handling equipment, but also to the interchange of timing and control data signals between such equipment (Sec. 1.4 of the Standard).

In order to ensure satisfactory noise immunity of the data signals to be communicated over connecting cables, the RS-232-C Standard provides that the data signals transmitted over the cables have magnitudes of at least ±6 volts (See Sec. 2.3 of the Standard). Since most data handling equipment today operate at five-volt levels, the Standard makes necessary additional power supplies for enabling a voltage level conversion of the data signals to be interchanged over the connecting cable.

With regard to mechanical characteristics of the interface, the RS-232-C Standard states that the interface is "located at a pluggable connector signal interface point between the two equipments. The female connector . . . should be mounted in a fixed position near the data terminal equipment". (Sec. 3.1). FIG. 3.1 within the RS-232-C Standard assigns certain circuit functions to each of 25 connector pins associated with the pluggable connector at the signal interface point. While the Standard does not specify a particular type of multiple pin connector (See Appendix I to the Standard), the "D-type" 25 pin connector (for example, AMP type 206584-1) has essentially become an industry standard.

A printed circuit board together with circuit components and software necessary to achieve an RS-232-C interface between a computer terminal on one side, and modems or serial line printers on the other side, is available from a variety of manufacturers. Such boards are mountable inside the computer, and separate cable is provided. These boards are compatible from the RS-232-C side but they differ on the computer side from computer to computer.

Figure 1:
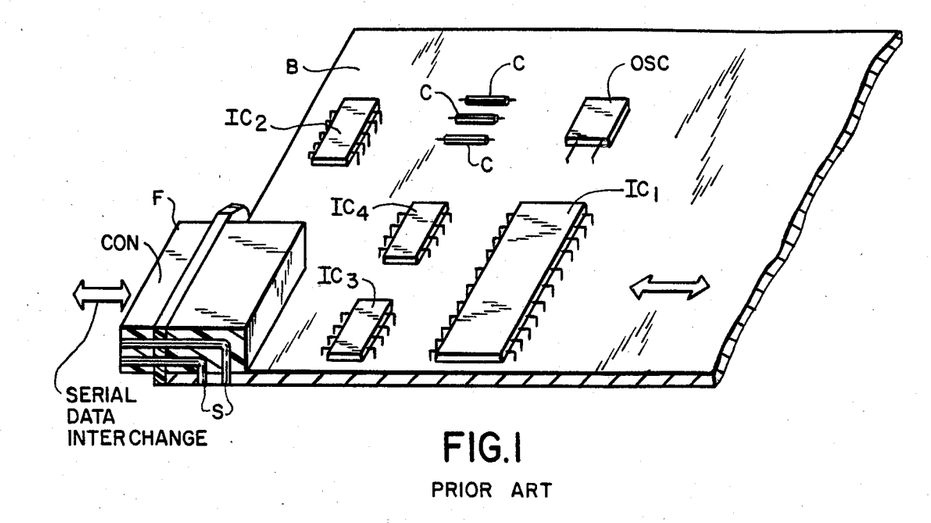
FIG. 1 is a perspective view of a conventional serial interface arranged on a portion of a printed circuit board.

The known RS-232-C interfaces which include a printed circuit board are arranged physically as shown in FIG. 1. The board B can be a "stand alone card" and be connected via a card cage connector (not shown) to various parallel signal bus lines associated with a microprocessor in a computer or other terminal equipment (also not shown). Alternatively, it can be a part of a more complex board. The RS-232-C Standard 25-pin connector CON may be mounted along one edge of the board B as shown, and the pins directly connected electrically to printed conductors on the board by soldering as at points S on the underside of the board B. This leaves a female connector part F fixedly mounted near the data terminal equipment as required by the Standard. The various conductors to which the pins of the connector CON are connected lead to electrical circuitry arranged over other portions of the board B, including, for example, a main logic element chip IC 1, line driver IC 3, line receiver IC 4, crystal oscillator OSC, frequency divider IC 2, and a number of discrete components C.

It will be appreciated that the known RS-232-C interface board arrangements require that a certain amount of space be allocated in existing equipment for their insertion, such space often being at a premium in units intended to be portable and of small overall dimensions. As far as is known, there has been no attempt to integrate any electrical interface circuitry, including those components required to implement the RS-232-C interface as shown in FIG. 1, within the prescribed interface connector itself such as the 25-pin connector CON.

A connector is known from U.S. Pat. No. 3,790,858 to Brancaleone et al within which RF filter elements are connected to a number of parallel pin-like contact elements which are supported inside and extend axially through a cylindrical shell. The filter elements are connected internally between the contact elements and a common cylindrical metal ground plate.

SUMMARY OF THE INVENTION

A primary object of the present invention is to provide a connector which exhibits simultaneously both the electrical characteristics and the connector requirements of a specified interface between two different data handling systems or equipments.

Another object of the invention is to provide a method wherein electrical circuitry for carrying out a specified function between two different data handling systems is integrated within a connector housing so as to reduce significantly spatial requirements within equipment associated with the systems.

According to one aspect of the invention, a connector includes a housing having a first set and a second set of terminals extending at least partly through wall parts of the housing to engage corresponding terminals of first and second outside connection means associated with first and second data handling systems, respectively. Logic interface circuit means is arranged within the connector housing and coupled between the first and second set of terminals. The circuit means operates to convert data signals transmitted to the first set of terminals from the first data handling system in a first type of format into corresponding data signals in a second type of format, and to provide the corresponding data signals in the second type of format to the second set of terminals for transmisson to the second data handling system. The circuit means also operates to convert data signals transmitted to the second set of terminals from the second data handling system in a second type of format into corresponding data signals in a first type of format, and to provide the corresponding data signals in the first type of format to the first set of terminals for transmission to the first data handling system.

According to another aspect of the invention, a method of implementing a logical interface to enable communications between a first data handling system in which data signals are arranged in a first type of format, and a second data handling system in which data signals are arranged in a second type of format, includes the steps of providing a connector housing; supporting first and second sets of electrical contact elements on the housing; containing electrical circuitry within the connector housing and connecting the circuitry with the first and the second sets of contact elements by arranging conductors inside the housing; converting by way of the electrical circuitry data signals transmitted to the first set of electrical contact elements in a first type of format from a first data handling system outside the connector housing into corresponding data signals in a second type of format and providing same to the second set of electrical contact elements through the conductors inside the connector housing; and converting by way of the electrical circuitry data signals transmitted to the second set of electrical contact elements in the second type of format from a second data handling system outside the connector housing into corresponding data signals in the first type of format and providing same to the first set of electrical contact elements through the conductors inside the connector housing.

The invention will be more clearly understood upon reading the following detailed description of preferred embodiments thereof in conjunction with the accompanying drawing.

DETAILED DESCRIPTION OF THE INVENTION

Figure 2:
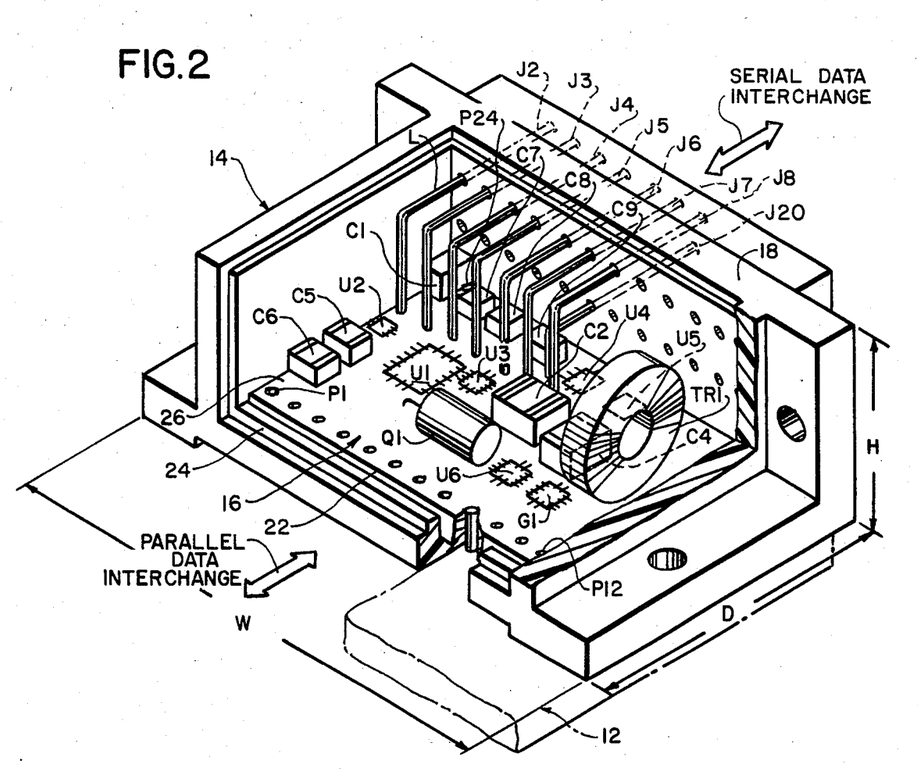
FIG. 2 is a perspective view, with parts broken away, showing a first embodiment of a connector according to the present invention mounted on a printed circuit board.

FIG. 2 shows a first embodiment of a connector 10 according to the invention, the connector 10 being mounted on a printed circuit board 12 associated with a data handling system or equipment (not shown) in which data is interchanged in a parallel format. The connector 10 includes a connector housing 14, portions of which are omitted in FIG. 2 for the purpose of illustrating electrical circuitry 16 mounted in the interior space of the housing 14. It is preferable that walls of the housing 14 substantially enclose the interior space so as to protect the circuitry 16 contained therein.

As shown in FIG. 2, the housing 14 is in the form of a generally rectangular hollow block and includes a front wall 18, a part of which projects outwardly to define first outside connection surface 20 parallel to the inside surface of wall 18. Housing 14 also includes a bottom wall 22 the outside surface of which defines a second outside connection surface 24. The outside dimensions of the housing 14, particularly those of the front wall 18 together with the first outside connection surface 20, preferably conform to those of a standard socket connector, thereby being adapted to mate with a standard plug connector or corresponding or complementary configuration. For applications in the RS-232-C interface, the housing 14 should conform to the dimensions of the known 25-pin "D type" subminiature connector mentioned earlier. Typical dimensions for the housing 14 thus may be a height H of about 0.5 inches (12.70 mm.), a depth D of about 1.2 inches (30.48 mm.) and a width W of about 2.0 inches (50.80 mm.).

The electrical circuitry 16 includes, in the embodiment of FIG. 2, a carrier in the form of a single printed circuit board or substrate 26 mounted closely adjacent and parallel to the inside surface of the bottom wall 22. Various integrated circuits and discrete components are mounted on the board 26, and are electrically connected by soldering, or by other technology, to conductors on one or both sides of the board 26.

Figure 3:
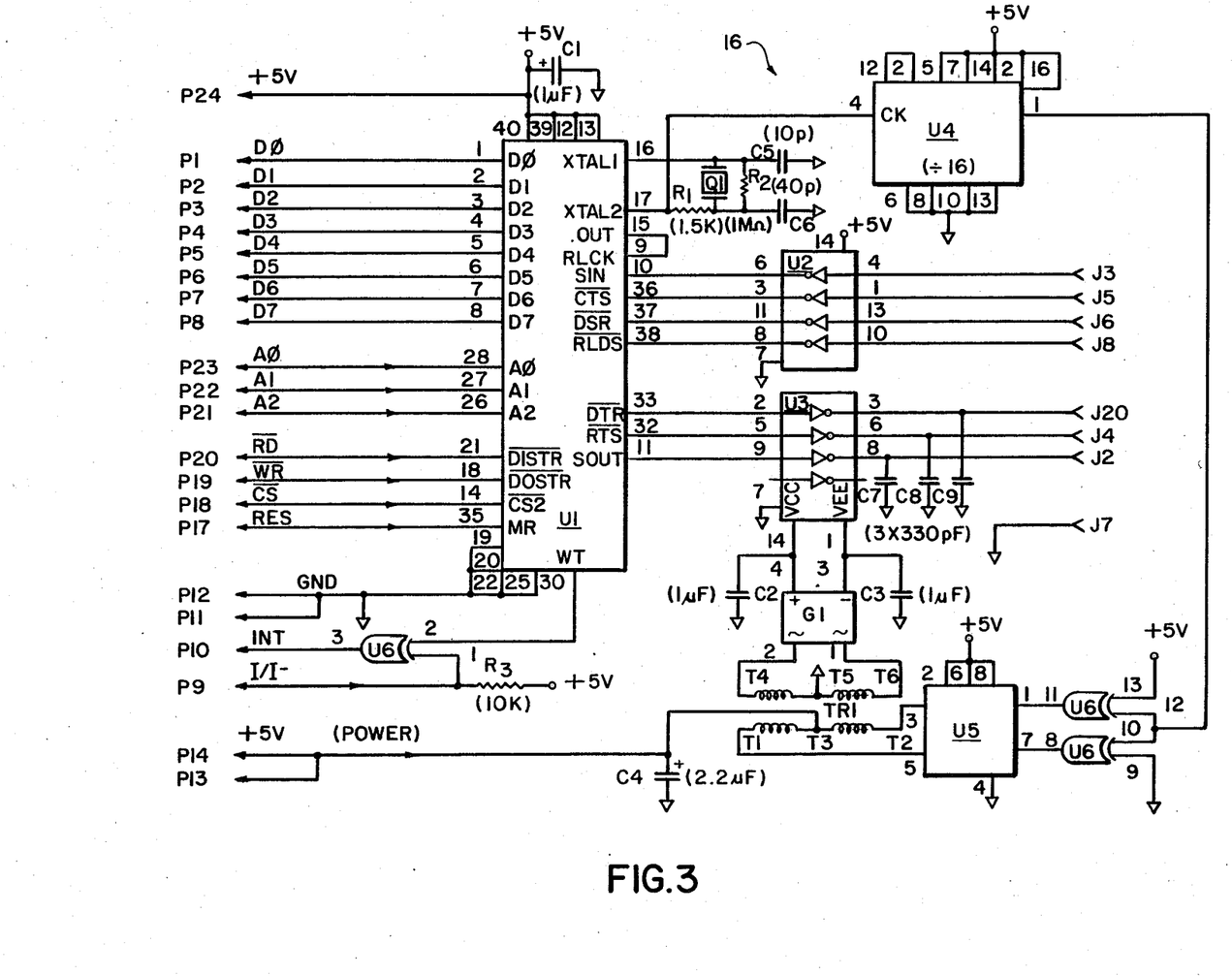
FIG. 3 is a schematic diagram representing electrical circuitry contained in the housing of the connector in FIG. 2.

The various "chips" and components shown in FIG. 2 as contained within the connector housing 14 on the board 26, and represented schematically in FIG. 3, include integrated circuits U1–U6; four tantalum chip capacitors C1–C4; a set of five chip capacitors $C_5$–$C_9$; a quartz crystal Q1; a toroid core transformer TR1 having bifilar wound primary and secondary windings T1–T2 and T4–T6; and a Graetz diode bridge G1. Each of eight conductors L extends from a different one of eight connection points on the printed circuit board 26 (FIG. 2), to corresponding female electrical contact elements or terminals J2–J8 and J20 which extend partly through and are supported in openings in the wall 18. The outside ends of the female contact elements are exposed at the first outside connection surface 20 to engage corresponding pins of an outside plug connector (not shown). The numbers assigned to the female contact elements J2–J8 and J20 correspond to the pin number-circuit function asssigments prescribed in the RS-232-C Standard, mentioned earlier. Further, 24 male electrical contact elements or pins P1–P24 extend in two parallel rows of 12 pins each, downwardly from connection points near the long edges of the board 26 (FIG. 2), to engage openings in printed conductors or a conventional dual in line socket on the outside printed circuit board 12, at the second outside connection surface 24.

In accordance with a preferred technique of manufacture, the housing 14, except for the bottom wall 22, is molded in one piece; the elements or terminals J2–J8 and J20, as well as the conductors L, being included in the molding operation. Then, the bottom wall 22 and abutting printed circuit board 26 are snapped into position in the housing. By means of localized heating, the bottom wall is fused to the housing so that a completely unitary structure is achieved.

FIG. 3 shows the interconnections between the chips and other electrical components on the printed circuit board 26 contained within the connector housing 14, together with the female and the male contact elements arranged on the first and the second outside connection surfaces 20, 24 of the connector 10, respectively. The circuitry of FIG. 3 is one example of circuitry which functions to provide the electrical characteristics of an RS-232-C interface, but it will be appreciated that different circuitry may be integrated within the connector housing 14 to carry out the same function or other commonly used interfaces including 8-bit Parallel, GPIB (general purpose interface bus-IEEE 488), and Ethernet.

The integrated circuit U1 may be, for example, National Semiconductor type INS 8250A. The circuit U1 serves as a main logic element which handles all data signal interchanges between, e.g., a microprocessor (not shown) which handles data in a parallel bit format and communications equipment (not shown) which sends and receives serial bit data. Circuit U1 contains several programmable registers which determine the communications format and all the necessary information data to perform successfully a two-way data interchange between two data systems of different data formats. Specifically, before sending or receiving any data via an RS-232-C line, a controlling microprocessor (not shown) must load the internal registers with the required commands. The system software contains the following load functions which, when programmed within circuit U1, enable the latter to be used for data communications. The preprogrammed functions are:

1. Baud rate and baud rate factor;
2. Character length;
3. Number of stop bits;
4. Parity enable/disable and parity polarity;
5. Modem control functions; and
6. Additional operational conditions.

Instructions representing the above load functions are transmitted to the circuit U1 from an outside microprocessor (not shown) over data bus lines DO–D7 corresponding to the male contact elements or pins P1–P8 on the second outside connection surface 24 of the connector housing 14 (FIG. 2). The appropriate registers within circuit U1 are selected by the address bus lines A, A1 and A2 (pins P23, P22 and P21), and a write signal ($\overline{WR}$, pin P19) validates the register loadings.

When data characters are transmitted by the outside microprocessor after the foregoing initialization procedure, the circuit U1 performs a parallel-to-serial data conversion. First, the eight-bit parallel data is placed into a transmitter register within circuit U1 which then automatically adds a start bit, followed by the data character bits themselves (least significant first) and the programmed number of stop bits for each character. Also, an even or odd parity bit is inserted prior to the stop bit(s) as defined previously by the system program. The character is then transmitted as a serial data stream on a data output line $S_{out}$ at terminal 11 of the circuit U1. The rate at which the data is shifted out is determined by another previously programmed register within circuit U1. The quartz crystal Q1 coupled to the circuit U1 operates together with a programmable divider within circuit U1 to generate a signal of the appropriate frequency for shifting out the data bits.

The strength or voltage levels of the data bits or signals shifted out from the circuit U1, typically TTL compatible (zero to +5 volts). As mentioned earlier, the RS-232-C Standard requires a stronger signal level so that data can be transmitted over a long cable with the capacity of noise suppression. Accordingly, a line driver circuit U3, e.g., Motorola type MC 1488, is coupled to data output $S_{out}$ and supplementary handshake signals as $\overline{RTS}$ (Request to Send) and $\overline{DTR}$ (Data Terminal Ready) of the circuit U1. When powered by an appropriate power supply, the line driver circuit U3 converts the TTL compatible level (zero to +5 volt) of the serial output from the circuit U1, to a ±12 volt level sufficient to satisfy the RS-232-C Standard. The integral power supply is constructed of a push-pull mode switching scheme, performed by high frequency oscillator derived from U4 (e.g. 4516B RCA), 74C86 exclusive OR gates (U6 e.g. Nat. Semiconductor), high current power transistors within U5 (75951 e.g. Texas Instruments) Tr1 transformer, G1 diode bridge and C2,C3 tantalum capacitors.

When a serial data bit stream is transmitted to the connector 10 from an outside data handling system, specifically to the female contact elements J3 at the first outside connection surface 20 of the housing 14, the higher voltage level of the bit streams is converted to a TTL compatible (0 to 5 volt) logic level by way of buffer-inverters within circuit U2 (e.g., Motorola type MC 1489A). Also, high level complementary signals (J5, J6 and J8 are converted down). The serial data is then shifted into a receiver register within the main logic element circuit U1 where the data is converted into a parallel format; however, the start and stop bits and the parity bit are subtracted. Thus, the data is then ready to be sent to the microprocessor or other outside parallel format data system over the data bus lines DO-D7.

The circuit U1 is selected for operation by the microprocessor or other outside parallel data system connected to the pins P1-P24 of the connector 10 by way of a chip select signal ($\overline{CS}$, pin P18). The receiver register within the circuit U1 is selected by a preset combination of the address bus lines (AO, A1, A2; pins P23, P22, P21), and the parallel data is placed on the data bus lines (DO-D7; pins P1-P8) for transmission to the outside microprocessor. A read signal ($\overline{RD}$, pin P20) activates the data reading from the circuit U1 to the microprocessor. Likewise, status information reading procedure can be performed similarly.

There are several control signals, and control and status registers in circuit U1 that determine the bidirectional serial communication procedure. All the necessary signals, including "handshaking", status and command bits, and modem control are included in communications following the preprogrammed functions from the outside microprocessor software.

Those components on the board 16 (FIG. 2) which have not been discussed above in detail but appear in the circuitry of FIG. 3 will be recognized and understood by those skilled in the art. A preferred quartz crystal Q1 is Seiko type DS-MGQ, 1.8432 MHz, series resonant. The chip capacitors C1-C4 may be Arco type ACT, tantalum, and the chip capacitors C5-C9 may be Murata type GR40 Y5 V. Chip resistors R1-R3 can be panasonic type ERJ-86CSJ, or alternatively can be thick film resistors deposited on the board 16.

The toroid transformer TR1 preferably is made from a Ferroxcube core type 266CT125, material 4C4. The primary winding is 2×10 turns and the secondary is 2×25 turns, both bifilar.

Figure 4:
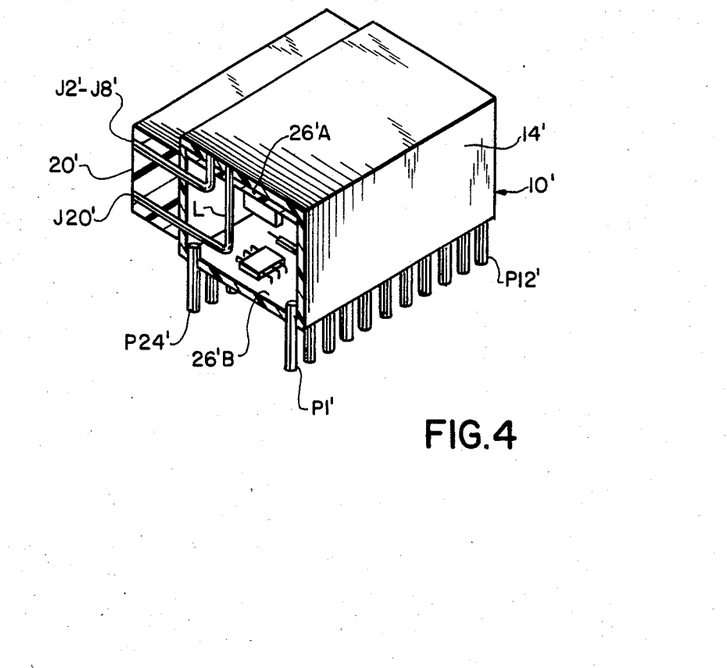
FIG. 4 is a perspective view of a second embodiment of a connector according to the present invention.

FIG. 4 shows a second embodiment of a connector 10' according to the invention. The outside dimensions and overall appearance of the connector 10' are generally similar to those of the connector 10 of FIG. 2. Two printed circuit boards or substrates 26'A and 26'B are, however, provided in housing 14' instead of the single board 26 in FIG. 2. Board 26'A extends at the top of the housing 14' parallel to the board 26'B which extends across the bottom of housing 14'. Board 26'B carries 24 pins P1'-P24' on its bottom outside surface 24' for connection directly to an outside circuit board or into a dual-in-line socket. The board 26'A is coupled by leads L' to female contact elements J2'-J8' and J20' which engage an outside plug connector at connection surface 20' of the connector 10'.

Figure 5:
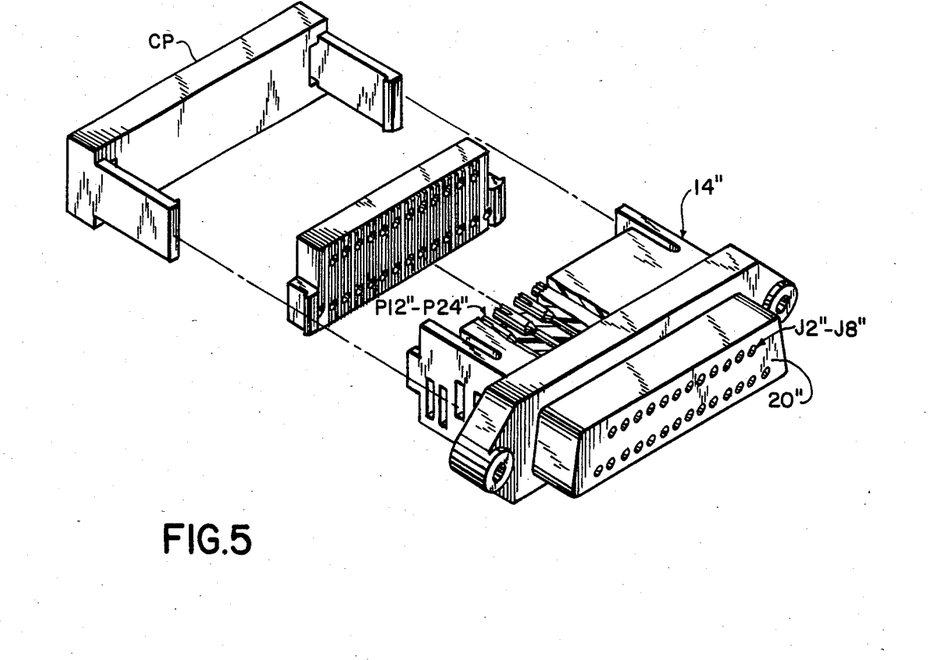
FIG. 5 is a perspective view of a third embodiment of a connector according to the present invention.

FIG. 5 shows a third embodiment of a connector 10'' according to the invention. A single, flexible printed circuit board 26'' is contained within the connector housing 14''. Conductors at one end of the board 26'' are directly to the inside of female contact elements J2''-J8'' and J20'' which are arranged to engage an outside plug connector at contact surface 20''. Conductors at an opposite end of the flexible board 26'' are connected directly to the inside ends of insulation displacement type pins P1''-P24''. A cap CP is constructed and arranged to clamp a flat insulated cable (not shown) over pointed ends of pins P1''-P24'' so that the pins pierce through the cable insulation to electrically contact corresponding conductors of the flat cable.

It will be appreciated that the connector of the present invention provides a completely self-contained interface unit which eliminates all the inconveniences of designing and realizing a data interface such as the RS-232-C Standard. Particular components no longer need be selected to meet the requirements of the Standard, voltage level conversions are provided for, and time consuming test procedures and debugging are eliminated. The present connector thus saves engineering effort, development and production time as well as labor costs. Importantly, a considerable space savings is achieved in terminal equipment which would otherwise require means to accommodate a separate interface board.

Figure 6A:
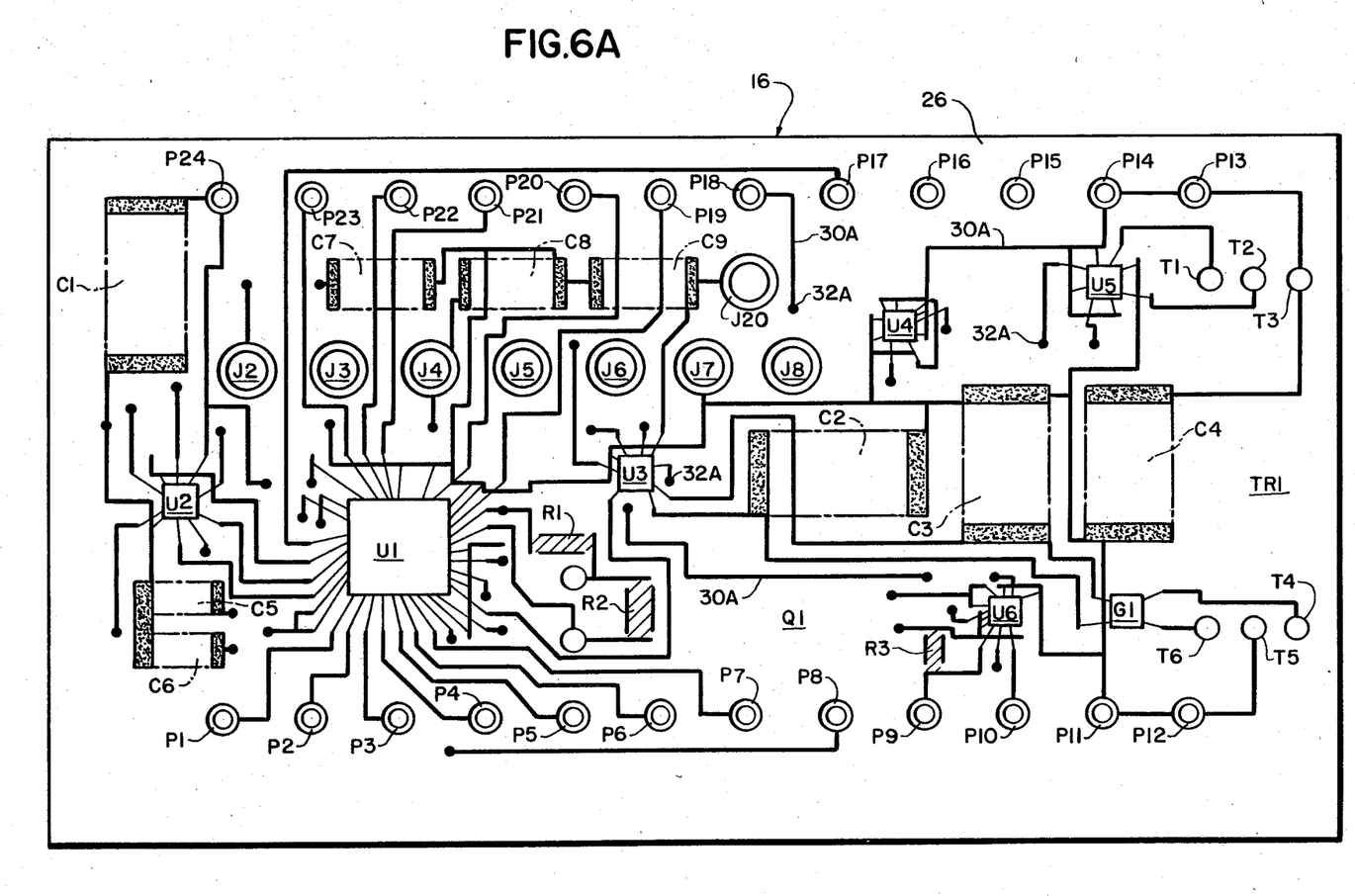
FIG. 6A is a top plan view of a printed circuit layout, and the phantom outline of the components, of the electrical circuitry seen in the schematic diagram of FIG. 3.

In order to enable the man skilled in the art to practice this invention in some detail, a complete printed circuit layout is shown in FIG. 6. This layout conforms with the circuitry previously illustrated in schematic form in FIG. 3. The contact areas J2-J8 and J20, which correspond with the respective female contact elements so designated, will be seen in FIG. 6A. Likewise, contact areas P1-P12 (at the near longitudinal edge) and P13-P24 (at the far edge), which correspond with the respective male contact elements bearing the same designation. Capacitors C1-C9, oscillator Q1, and transformer TR1, are seen in phantom outline while resistors R1, R2 and R3 are represented by means of hatch lines. All the other principal elements are shown by means of rectangles suitably labeled. Appropriate wire bonding from the several integrated circuits U1-U6, as well as from the Graetz bridge G1, is shown in FIG. 6A connected to the conductors 30A on the printed circuit board.

Figure 6B:
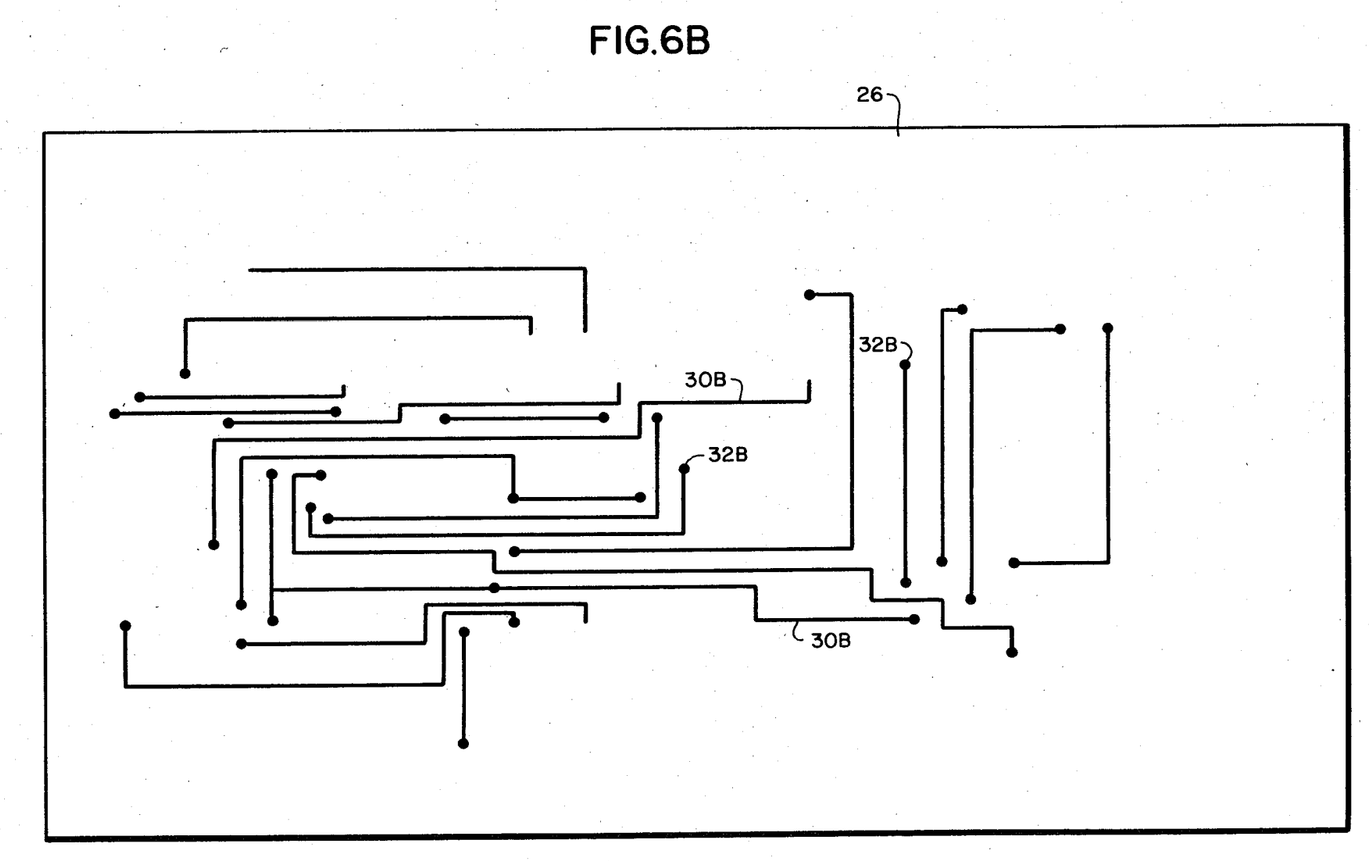
FIG. 6B is a bottom plan view of the printed circuit board illustrating the interconnection among the various components.

It will be noted by the skilled worker that suitably correlated conductors 30B are provided on the lower surface of the printed circuit board 26 (FIG. 6B) so as to make the requisite interconnections among components. The dots 32 represent so-called "vias" between the upper and lower surfaces of board 26.

It will be appreciated that, for the sake of clarity, the depiction of a printed circuit layout for a circuit board 26 to be housed in connector 10 of FIG. 2 is greatly enlarged (approximately 7 times).

While specific embodiments of the invention have been shown and described in detail to illustrate the application of the inventive principles, it will be understood that the invention may be embodied otherwise without departing from such principles.

I claim:
1. An electrical connector for implementing a direct predetermined logical interface between a first data handling system wherein data signals are arranged in a first type of format, and a second data handling system wherein data signals are arranged in a second type of format, comprising:
   a connector housing including a first wall part forming a first outside connection surface and a second wall part forming a second outside connection surface;
   a first set of terminals arranged to extend at least partly through said first wall part from inside said connector housing in a given configuration for engaging in electrical contact with corresponding terminals of first outside connection means associated with the first data handling system, with said first set of terminals forming a single logical interface member for matingly engaging a corresponding single logical interface member formed by said corresponding terminals associated with the first data handling system;

a second set of terminal arranged to extend at least partly through said second wall part from inside said connector housing in a given configuration for engaging in electrical contact with corresponding terminals of second outside connection means associated with the second data handling system, with said second set of terminals forming a single logical interface member for matingly engaging a corresponding single logical interface member formed by said corresponding terminals associated with the second data handling system; and logic interface circuit means arranged within said connector housing and coupled between said first set of terminals and said second set of terminals for converting data signals transmitted to at least some of said first set of terminals from the first data handling system in the first type of format into corresponding data signals in the second type of format and providing said corresponding data signals in the second type of format to at least some of said second set of terminals for subsequent transmission to the second data handling system, and for converting data signals transmitted to at least some of said second set of terminals from the second data handling system in the second type of format into corresponding data signals in the first type of format and providing said corresponding data signals in the first type of format to at least some of said first set of terminals for subsequent transmission to the first data handling system.

2. A connector according to claim 1, wherein said logic interface circuit means comprises means for converting data signals transmitted to at least some of said first set of terminals in a serial format into corresponding data signals in a parallel format and providing the corresponding parallel data signals to at least some of said second set of terminals, and for converting data signals transmitted to at least some of said second set of terminals in a parallel format into corresponding data signals in a serial format and providing the corresponding serial data signals to at least some of said first set of terminals.

3. A connector according to claim 1, wherein said logic interface circuit means comprises means for converting the voltage level of the data signals transmitted to at least some of said first set of terminals from a first voltage level into a second voltage level and providing the corresponding data signals at the second voltage level to at least some of said second set of terminals, and for converting the voltage level of the data signals transmitted to at least some of said second set of terminals from the second voltage level into the first voltage level and providing the corresponding data signals at the first voltage level to at least some of said first set of terminals.

4. A connector according to claim 1, wherein said logic interface circuit means comprises a printed circuit substrate mounted within said connector housing.

5. A connector according to claim 1, wherein said logic interface circuit means comprises an integrated circuit mounted within said connector housing.

6. A connector according to claim 4, comprising an integrated circuit mounted on said printed circuit substrate.

7. A connector according to claim 1, wherein said first set of terminals comprises a number of female contact elements arranged to mate with corresponding male contact elements of the first outside connection means, said first wall part of said connector housing having a number of openings in said first connection surface within which openings said female contact elements are fixedly supported, and said second set of terminals comprises a number of male contact elements arranged to mate with corresponding female contact elements of the second outside connection means, said second wall part of said connector housing having a number of openings in said second connection surface within which openings said male contact elements are fixedly supported.

8. A connector according to claim 7, wherein said first connection surface extends generally within a first plane, and said second connection surface extends generally within a second plane.

9. A connector according to claim 8, wherein said second plane is perpendicular to said first plane.

10. A connector according to claim 8, wherein said second plane is parallel to said first plane.

11. A connector according to claim 8, wherein said male contact elements are arranged in two parallel rows for engaging corresponding openings formed in the female contact elements of the second outside connection means.

12. A connector according to claim 1 wherein said connector housing has structural dimensions of a height of no more than about 0.5 inches (12.70 mm), a depth of no more than about 1.2 inches (30.48 mm), and a width of no more than about 2.0 inches (50.80 mm).

13. A connector according to claim 1 wherein said connector housing comprises walls forming an enclosure member and wherein said logic interface circuit means are completely enclosed within the walls of said connector housing.

14. The connector of claim 1 wherein said first set of terminals comprises a number of male contact elements adapted for direct integrated electrical mating with a printed circuit board member which handles data in said first type of format and wherein said housing is adapted to be physically supported by said printed circuit board.

15. The connector of claim 1 wherein said first set of terminals comprises a number of male contact pins adapted for direct integrated electrical mating with an insulated ribbon cable connector member, with said pins being adapted to pierce the insulation of said cable to electrically contact conductors of said cable whereby said electrical mating is effected said cable connector member being adapted to be electrically connected to a printed circuit board which handles data in a first format and wherein said connector comprises means to physically enclose a portion of said ribbon cable connector.

16. The connector of claim 13 wherein said logic interface circuit means furthr comprises a power supply, with said power supply being contained within said walls of said connector housing.

17. A "D-type" 25 pin RS-232-C connector having a male connection interface adapted for direct integrated electrical mating with a printed circuit board member which handles data in a parallel format, said connector further having a female connection interface for mating connection with an external male connection interface member from a device which handles data in a serial format, characterized in that means for converting data from said parallel format to said serial format and means for converting data from said serial format to said parallel format are electrically positioned between said male connection interface and said female connection interface within said connector, and wherein said connector is adapted to be physically supported by said printed circuit board.

18. A method of implementing a logical interface to enable communications between first and second data handling systems wherein data signals are arranged in a first type format in the first system and in a second type of format in the second system, comprising the steps of:

providing a connector housing and supporting first and second sets of electrical contact elements on the connector housing;

exposing the first set of electrical contact elements on one portion of the outside surface of the connector housing and exposing the second set of electrical contact elements on another portion of the outside surface of the connector housing;

arranging the first set of electrical contact elements for connection with the first data handling system outside of the connector housing and arranging the second set of electrical contact elements for connection with the second data handling system outside of the connector housing, wherein each of said first and second set of electrical contact elements comprises a single logical interface member, and wherein said interface members of said first and second set of electrical contact elements are matingly electrically connected to a corresponding single logical interface member of said first and second data handling system respectively;

containing electrical circuitry substantially within the connector housing and connecting the electrical circuitry with the first and second sets of electrical contact elements by arranging conductors inside the connector housing;

converting by way of the electrical circuitry data signals transmitted to at least some of the second set of electrical contact elements in the second type of format from the second data handling system into corresponding data signals in the first type of format; and providing the corresponding data signals in the first type of format from the electrical circuitry through the conductors inside the connector housing to at least some of the first set of electrical contact elements.

19. The method of claim 18, including arranging one of the first and second sets of electrical contact elements for connection to corresponding terminals on an outside printed circuit board associated with one of the first and the second data handling systems.

20. The method of claim 18, including arranging one of the first and second sets of electrical contact elements for connection to an outside cable connector associated with one of the first and the second data handling systems.

21. The method of claim 18, including arranging a selected one of the first and second sets of electrical contact elements in the form of insulation displacement elements, piercing an insulated cable associated with one of the data handling systems with the displacement elements and electrically contacting the displacement elements with corresponding conductors inside the cable.

22. The method of claim 18, wherein one of said converting steps includes converting serial data into corresponding parallel data, and the other one of said converting steps includes converting parallel data into corresponding serial data.

23. The method of claim 12, including converting by way of the electrical circuitry the voltage level of the data signals transmitted to at least some of the first set of electrical contact elements from a first voltage level into a second voltage level and providing the corresponding data signals at the second voltage level to at least some of the second set of electrical contact elements through the conductors inside the connector housing, and converting by way of the electrical circuitry the voltage level of the data signals transmitted to at least some of the second set of electrical contact elements from the second voltage level into the first voltage level and providing the corresponding data signals at the first voltage level to at least some of the first set of electrical contact elements through the conductors inside the connector housing.

* * * * *

US004603320C1

(12) EX PARTE REEXAMINATION CERTIFICATE (5199th)
United States Patent
Farago (10) Number: US 4,603,320 C1
(45) Certificate Issued: Sep. 13, 2005

(54) CONNECTOR INTERFACE

(75) Inventor: Steven Farago, Mount Kisco, NY (US)

(73) Assignee: Acticon Technologies LLC, Monsey, NY (US)

Reexamination Request:
No. 90/006,857, Nov. 10, 2003

Reexamination Certificate for:
Patent No.: 4,603,320
Issued: Jul. 29, 1986
Appl. No.: 06/484,823
Filed: Apr. 13, 1983

(51) Int. Cl.$^7$ ............................................. H03M 9/00
(52) U.S. Cl. ......................... 341/89; 341/100; 341/101; 361/685; 439/65
(58) Field of Search ................................. 341/100, 101; 439/389, 391, 393, 620, 621, 622

(56) References Cited

U.S. PATENT DOCUMENTS

| | | | | |
|---|---|---|---|---|
| 3,327,174 A | * | 6/1967 | Barre et al. ................... | 361/744 |
| 3,395,400 A | * | 7/1968 | De Witt et al. .............. | 341/100 |
| 3,406,368 A | * | 10/1968 | Curran ......................... | 439/79 |
| 3,408,612 A | * | 10/1968 | Bute et al. .................... | 439/68 |
| 3,437,882 A | * | 4/1969 | Cayzer ......................... | 361/791 |
| 3,573,799 A | * | 4/1971 | Drinnan et al. ............... | 341/81 |
| 3,643,135 A | * | 2/1972 | Devore et al. ............... | 361/730 |
| 3,646,573 A | * | 2/1972 | Holmes, Jr. .............. | 178/4.1 R |
| 3,790,858 A | * | 2/1974 | Brancaleone et al. ....... | 174/260 |
| 3,863,226 A | * | 1/1975 | Ryburn ........................ | 710/71 |
| 3,903,404 A | * | 9/1975 | Beall et al. .................. | 361/687 |
| 3,946,379 A | * | 3/1976 | Lippman .................... | 341/100 |
| 3,997,879 A | * | 12/1976 | Markley et al. .............. | 714/24 |
| 4,023,144 A | * | 5/1977 | Koenig ........................ | 710/71 |
| 4,024,505 A | * | 5/1977 | Sperling ........................ | 710/2 |
| 4,031,371 A | * | 6/1977 | DeVries ....................... | 361/686 |
| 4,034,346 A | * | 7/1977 | Hostein ....................... | 710/106 |

(Continued)

FOREIGN PATENT DOCUMENTS

| | | | | | |
|---|---|---|---|---|---|
| JP | 56061856 A | * | 5/1981 | ........... | H04L/11/00 |
| JP | 57087255 A | * | 5/1982 | ........... | H04L/11/00 |
| JP | 58047352 A | * | 3/1983 | ........... | H04L/13/00 |

OTHER PUBLICATIONS

Whittaker, "A mass-termination, filtered connector for RS232-C circuits", Thirteenth Annual Connector Symposium Proceeding 1980, pp. 197–204.*

(Continued)

*Primary Examiner*—Howard Williams
(74) *Attorney, Agent, or Firm*—Paul J. Lerner (57) ABSTRACT

A connector interface for enabling communications between first and second data handling systems wherein the data in the first system is arranged in a first type of format and the data in the second system is arranged in a second type of format, includes a connector housing with first and second sets of electrical contact elements exposed at different portions of the housing. Circuitry contained entirely within the housing operates to convert data transmitted to the first set of contact elements from the first data handling system into corresponding data in the second type of format for transmission to the second data handling system through the second set of contact elements, and to convert data transmitted to the second set of contact elements from the second data handling system into corresponding data in the first format for transmission to the first data handling system. One set of electrical contact elements may, for example, be arranged to extend out from the connector housing in two parallel rows to allow the elements to be directly connected to corresponding terminals arranged in a dual in line configuration on an outside printed circuit board. The connector arrangement greatly simplifies the design and construction of data processing systems requiring specific interfaces between certain parts of the systems, such as between data terminal equipment and data communication equipment employing serial binary data interchange.

U.S. PATENT DOCUMENTS

| | | | | |
|---|---|---|---|---|
| 4,038,642 A | * | 7/1977 | Bouknecht et al. | 710/20 |
| 4,048,673 A | * | 9/1977 | Hendrie et al. | 710/305 |
| 4,053,950 A | * | 10/1977 | Bourke et al. | 710/22 |
| 4,054,947 A | * | 10/1977 | Shanks et al. | 710/16 |
| 4,065,662 A | * | 12/1977 | Garczynski et al. | 235/419 |
| 4,079,372 A | * | 3/1978 | Koenig | 341/100 |
| 4,115,849 A | * | 9/1978 | Johnson et al. | 370/464 |
| 4,115,856 A | * | 9/1978 | Labeye-Voisin et al. | 710/106 |
| 4,124,888 A | * | 11/1978 | Washburn | 710/8 |
| 4,124,889 A | * | 11/1978 | Kaufman et al. | 710/2 |
| 4,127,896 A | * | 11/1978 | Raslavsky, III | 703/26 |
| 4,137,559 A | * | 1/1979 | Reuting | 361/735 |
| 4,150,438 A | * | 4/1979 | Dorey et al. | 710/105 |
| 4,152,750 A | * | 5/1979 | Bremenour et al. | 361/686 |
| 4,206,962 A | * | 6/1980 | Shue et al. | 439/620 |
| 4,217,624 A | * | 8/1980 | Tuck | 361/686 |
| 4,242,721 A | * | 12/1980 | Krolak et al. | 361/686 |
| 4,245,300 A | * | 1/1981 | Kaufman et al. | 710/1 |
| 4,246,637 A | * | 1/1981 | Brown et al. | 710/62 |
| 4,250,407 A | * | 2/1981 | Dorey et al. | 326/47 |
| 4,250,563 A | * | 2/1981 | Struger | 710/63 |
| 4,253,143 A | * | 2/1981 | Onodera et al. | 708/108 |
| 4,253,146 A | * | 2/1981 | Bellamy et al. | 709/226 |
| 4,254,462 A | * | 3/1981 | Raymond et al. | 710/63 |
| 4,261,035 A | * | 4/1981 | Raymond | 709/236 |
| 4,275,455 A | * | 6/1981 | Bartlett | 700/1 |
| 4,277,646 A | * | 7/1981 | Sams | 379/93.05 |
| 4,293,924 A | * | 10/1981 | Struger et al. | 710/14 |
| 4,309,754 A | * | 1/1982 | Dinwiddie, Jr. | 710/307 |
| 4,315,308 A | * | 2/1982 | Jackson | 710/33 |
| 4,328,484 A | * | 5/1982 | Denecke | 341/64 |
| 4,333,696 A | * | 6/1982 | O'Neill et al. | 439/61 |
| 4,348,636 A | * | 9/1982 | Doundoulakis | 714/46 |
| 4,350,973 A | * | 9/1982 | Petryk, Jr. | 398/202 |
| 4,354,268 A | * | 10/1982 | Michel et al. | 714/724 |
| 4,361,955 A | * | 12/1982 | Lancaster | 29/884 |
| 4,367,374 A | * | 1/1983 | Serrano | 379/442 |
| 4,375,103 A | * | 2/1983 | Arneth et al. | 375/358 |
| 4,395,610 A | * | 7/1983 | Downs et al. | 200/292 |
| 4,398,780 A | * | 8/1983 | Novotny et al. | 439/284 |
| 4,401,351 A | * | 8/1983 | Record | 439/61 |
| 4,403,111 A | * | 9/1983 | Kelly | 178/69 R |
| 4,404,651 A | * | 9/1983 | Grudowski | 710/19 |
| 4,409,587 A | * | 10/1983 | Scott | 341/97 |
| 4,426,166 A | * | 1/1984 | Bowling | 400/62 |
| 4,428,043 A | * | 1/1984 | Catiller et al. | 709/250 |
| 4,428,044 A | * | 1/1984 | Liron | 714/12 |
| 4,432,604 A | * | 2/1984 | Schwab | 385/60 |
| 4,434,472 A | * | 2/1984 | Kachun | 345/565 |
| 4,443,850 A | * | 4/1984 | Harris | 710/23 |
| 4,443,865 A | * | 4/1984 | Schultz et al. | 712/242 |
| 4,443,884 A | * | 4/1984 | Swarz | 375/377 |
| 4,445,213 A | * | 4/1984 | Baugh et al. | 370/405 |
| 4,445,215 A | * | 4/1984 | Svendsen | 370/517 |
| 4,447,804 A | * | 5/1984 | Allen | 341/100 |
| 4,451,884 A | * | 5/1984 | Heath et al. | 710/24 |
| 4,477,862 A | * | 10/1984 | Gonzales | 361/686 |
| 4,480,885 A | * | 11/1984 | Coppelman | 439/159 |
| 4,490,775 A | * | 12/1984 | Quan | 361/686 |
| 4,493,028 A | * | 1/1985 | Heath | 710/1 |
| 4,498,716 A | * | 2/1985 | Ward | 439/55 |
| 4,509,113 A | * | 4/1985 | Heath | 710/66 |
| 4,514,823 A | * | 4/1985 | Mendelson et al. | 710/2 |
| 4,516,173 A | * | 5/1985 | Abe et al. | 382/245 |
| 4,525,802 A | * | 7/1985 | Hackamack | 361/683 |
| 4,534,011 A | * | 8/1985 | Andrews et al. | 710/58 |
| 4,556,953 A | * | 12/1985 | Caprio et al. | 710/301 |
| 4,571,456 A | * | 2/1986 | Paulsen et al. | 379/457 |
| 4,597,631 A | * | 7/1986 | Flores | 385/53 |

OTHER PUBLICATIONS

Hodgetts, "A Shieleded Computer Interface connector", Fourteenth Annual Connector Symposium Proceedings, 1981, pp. 113–118.*

Rowe, "Give your Computeran RS–232C interface", Electornics Australia, vol. 41, No. 9, pp. 81, 83, 84, 139.*

Author Unknown, "Modem Survey", Datamation, vol. 25, No. 3, pp. 167–226.*

Goldman, "Modems–Integral Approach Gains Momentum," Data Communications User, Dec. 1975, p. 31.*

Hewlett–Packard Inc., "Operating Note Model 15104A 15115A 15116A", 1982.*

Magazine of Direct Marketing, Nov. 1982, p. 1291, "The Business Compurter Network Corp has introduced the 'Network Inquirer,' a handheld computer that enables users to access hundreds of public databases by selecting the network desired fro a list . . . ".*

Repko, M., "The Standard Interface", Systems International, vol. 9, No. 6, Jun. 1981, pp. 40–42.*

Polecat, H., "Universal VDU interface," Electronic Product Design, vol. 2 No. 2, Feb. 1981, p. 23.*

Commodore Business Machines, Inc. "VIC–20 The friendly computer VICMODEM," 1982.*

Smith, A.E., "You Can Take It With You," Business Computer Systems, vol. 1, No. 1, Sep. 1981, pp. 94–99.*

Hewlett–Packard HP 82950A Modem Owner's Manual Series 80, Jan. 1982.

Photocopy of a photograph of the circuit board from a HP 82950 modem.

Radio Shack TRS–80 Color Computer Disk System Owner's Manual and Programming Guide, Copyright 1981.

Radio Shack TRS–80 Micro Computer System Expansion Interface Catalog No. 26–1140/1141/1142, Copyright 1979.

Hewlett Packard HP 82938A HP–IL Interface Owner's Manual Series 80, Jan. 1982.

* cited by examiner

EX PARTE REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1–23 is confirmed.

\* \* \* \* \*